United States Patent [19]

Sugawara et al.

[11] 4,136,351

[45] Jan. 23, 1979

[54] PHOTO-COUPLED SEMICONDUCTOR DEVICE

[75] Inventors: Yoshitaka Sugawara; Tatsuya Kamei; Susumu Murakami; Tadahiko Miyoshi; Takuzo Ogawa, all of Hitachi, Japan

[73] Assignee: Hitachi, Ltd., Japan

[21] Appl. No.: 792,002

[22] Filed: Apr. 28, 1977

[30] Foreign Application Priority Data

May 12, 1976 [JP] Japan ................................. 51-53921

[51] Int. Cl.² ........................................... H01L 31/12
[52] U.S. Cl. ........................................ 357/19; 357/17; 357/68; 250/551
[58] Field of Search ............................ 357/19, 17, 68; 250/551

[56] References Cited

U.S. PATENT DOCUMENTS

| | | | |
|---|---|---|---|
| 3,436,548 | 4/1969 | Beard | 250/211 |
| 3,636,358 | 1/1972 | Groschivitz | 250/211 J |
| 3,890,636 | 6/1975 | Haroda | 357/68 |
| 4,001,859 | 1/1977 | Miyoshi | 357/19 |
| 4,032,962 | 6/1977 | Balyoz | 357/68 |
| 4,047,045 | 9/1977 | Paxton | 250/551 |
| 4,058,821 | 11/1977 | Miyoshi | 357/19 |

*Primary Examiner*—Martin H. Edlow
*Attorney, Agent, or Firm*—Craig & Antonelli

[57] ABSTRACT

A photo-coupled semiconductor device comprising a light-emitting semiconductor element, a light-receiving semiconductor element, and an insulation base supporting these two semiconductor elements. The insulation base has a pair of parallel surfaces and provides an optical path extending between the parallel surfaces for photo-coupling the semiconductor elements. Each of the semiconductor elements has at least two rigid electrodes extending in parallel to the parallel surfaces of the insulation base, and the electrodes are electrically and mechanically connected at one of their parallel surfaces by solder to conductive interconnection layers exposed at predetermined positions of one of the parallel surfaces of the insulation base. The device can satisfy both the desired increase in the efficiency of photo-coupling and the desired improvement in the massproductivity.

9 Claims, 6 Drawing Figures

PHOTO-COUPLED SEMICONDUCTOR DEVICE

BACKGROUND OF THE INVENTION

This invention relates to a photo-coupled semiconductor device commonly called a photo-coupler, and more particularly to improvements in the optical structure of such a device.

A photo-coupler has generally such a construction that a light-emitting element connected to an input terminal is disposed opposite to a light-receiving element or photosensitive element connected to an output terminal. In the photo-coupler, an electrical signal applied to the input terminal is converted once into light by the light-emitting element to be transmitted to the light-receiving element where the light is converted into the original electrical signal again to appear at the output terminal. Therefore, the photo-coupler is advantageous in that the input and output can be electrically isolated from each other. The photo-coupler having such an advantage is widely used as a signal transmission means between two coupled circuits in which there is a necessity for preventing electrical interference therebetween.

It is quite natural that one of the most important requirements for such a photo-coupler is a satisfactory efficiency of photo-coupling, and in order to provide a highest possible efficiency of photo-coupling, it is essential to improve the optical structure of the photo-coupling means between the light-emitting element and the light-receiving element.

While some proposals made heretofore in an effort to improve the optical structure of the photo-coupling means between the light-emitting element and the light-receiving element have been successful in improving the efficiency of photo-coupling to a certain extent, the prior art proposals have resulted in complexity of the structure of the photo-coupling means, and an undesirable reduction in the mass-productivity has been inevitably given rise to.

The light-emitting element used as the light source of the photo-coupler is classified into two types, that is, the type in which the light radiating surface lies in parallel to the light-emitting PN junction and the type in which the light radiating surface is disposed in orthogonal relation to the light-emitting PN junction. For conveniences of explanation, the former and latter types will be referred to hereinafter as a light-emitting element of vertically radiating type and a light-emitting element of horizontally radiating type, respectively. The light-emitting element of horizontally radiating type has a peculiar luminance distribution in its light radiating surface, and therefore, a photo-coupler having a very high efficiency of photo-coupling can be realized when the light-emitting element of this type is disposed opposite to the light-receiving element in such a relation that the luminance distribution of the light radiating surface of the former conforms to the photo-sensitivity distribution of the latter. In spite of the above fact, the light-emitting element of vertically radiating type has been mostly employed hitherto. One of the reasons therefore resides in the fact that the light-emitting element of horizontally radiating type requires a complex mounting structure which is not suitable for mass production.

SUMMARY OF THE INVENTION

It is therefore a primary object of the present invention to provide a novel photo-coupled semiconductor device which overcomes the aforementioned prior art defects and satisfies both the desired enhancement in the efficiency of photo-coupling and the desired improvement in the mass-productivity.

In accordance with a first aspect of the present invention, there is provided a photo-coupled semiconductor device comprising a light-emitting semiconductor element, a light-receiving semiconductor element, and means for supporting these two semiconductor elements, wherein the supporting means comprises a pair of surfaces extending in parallel to each other for supporting the two semiconductor elements respectively, and an optical path extending between the parallel surfaces for photo-coupling the two semiconductor elements to each other, and each of the semiconductor elements comprises at least two rigid electrodes having surfaces parallel to the parallel surfaces of the supporting means, the rigid electrodes being electrically and mechanically connected by solder to conductive interconnection layers exposed at predetermined portions of one of the parallel surfaces of the supporting means.

In accordance with a second aspect of the present invention, there is provided a photo-coupled semiconductor device of the above character, wherein the light-emitting semiconductor element may comprise a light-emitting assembly including at least one pellet of light-emitting element of horizontally radiating type, and a pair of block-like electrodes mounted on the opposite electrode-bearing surfaces of the pellet.

According to a third aspect of the present invention, there is provided a photo-coupled semiconductor device of the above character, wherein the light-receiving semiconductor element may comprise a semiconductor substrate having at least one light-receiving element formed therein, and the supporting means may comprise an electrical insulation layer provided on the semiconductor substrate.

According to a fourth aspect of the present invention, there is provided a photo-coupled semiconductor device of the above character, wherein the light-receiving semiconductor element may comprise a semiconductor substrate having at least one light-receiving element formed therein, and the supporting means may comprise a ceramic base provided by laminating and fixing to each other a first ceramic substrate having at least one central opening for receiving therein the light-emitting assembly and a second ceramic substrate having conductive interconnection layers exposed at predetermined positions of its surface, the light-emitting assembly being mounted on the ceramic base, and the semiconductor substrate being fixed to the ceramic base for receiving light radiated from the light-emitting assembly.

DETAILED DESCRIPTION OF THE INVENTION

For better understanding of the present invention, the structure of a switching device using a prior art photo-coupler employing a light-emitting element of horizontally radiating type will be described with reference to FIG. 1 before describing the present invention in detail.

Figure 1:
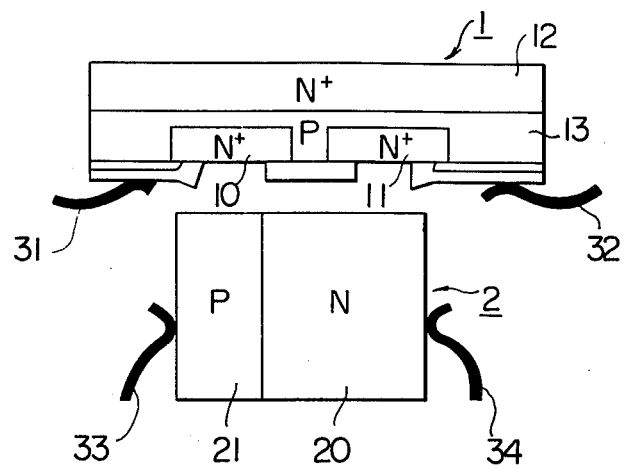
FIG. 1 is a schematic front elevational view showing the structure of an electrical switching device provided by a prior art photo-coupler employing a light-emitting element of horizontally radiating type.

Referring to FIG. 1, a light-receiving element 1 or a contact element in such a switching device comprises a pair of $N^+$-type emitter regions 10 and 11, an $N^+$-type collector region 12 and a P-type base region 13. A light-emitting element 2 or an actuating element in the switching device comprises an N-type region 20 and a P-type region 21 formed by doping a pellet of gallium arsenide with tellurium and zinc respectively. That is, this actuating element 2 is an injection laser diode of gallium arsenide. The lasing action of this diode is such that the diode emits coherent light of infrared wavelength of 8,400 Å having a beam divergent angle less than 4° at an efficiency close to 100% when current flows through the diode with current density of 10,000 to 100,000 amperes per square centimeter. This switching device is mounted by, for example, surrounding the elements with conventional metal-glass headers or mounting such a switch arrangement on a ceramic wafter or the like electrical insulation base and then depositing electrode leads 31 to 34 on the substrate.

In a typical prior art photo-coupler employing a light-emitting element of horizontally radiating type, a pellet of light-emitting element has generally been fixed in a recess formed on the surface of a base including laminated ceramic substrates, and electrode layers of the pellet of light-emitting element have been wire-bonded by leads to conductive interconnection layers provided on the ceramic base. Thus, extreme difficulty has actually been encountered in connecting the electrode layers of the pellet of the light-emitting element to the conductive interconnection layers on the base by means of wire bonding after positioning the pellet of the light-emitting element relative to the substrate having a light-receiving element formed thereon. The above difficulty has become more marked especially for the necessity that the pellet of the light-emitting element and the substrate having the light-receiving element formed thereon be disposed in close proximity to each other (generally, within the distance of less than 1 mm) in order to enhance the efficiency of photo-coupling. It has therefore been common practice that the substrate having the light-receiving element formed thereon and the pellet of the light-emitting element are fixed in the above-specified relation after completing the electrical wiring therefor. However, this is very unsatisfactory from the aspect of mass production, because provision of the electrical wiring and fixing of the elements are carried out in separate steps. Further, a lot of man-hours are required for assembling the light-emitting assembly by connecting the light-emitting element with the electrical wiring, and wire breaking trouble, breakdown trouble and other trouble tend to occur during setting the light-emitting assembly in a predetermined position due to a mechanical shock or like force which may be imparted to the light-emitting assembly.

Several proposals have been made hitherto in an effort to improve the mass-productivity. According to these proposals, the electrical wiring for the light-emitting element and that for the light-receiving element are disposed in planes parallel to each other, that is, in the same direction. However, these proposals are not always satisfactory from the viewpoint of enhancing the efficiency of photo-coupling. In one of such prior art proposals, the optical coupling between the light-emitting element and the light-receiving element is attained by reflecting light emitted from the side surface of the light-emitting element and directing the reflected light toward the light-receiving element. Although this proposal is effective in obviating an undesirable reduction in the mass-productivity due to the complex electrical wiring work, a light reflector of high precision must be accurately positioned, and in this sense, the method disclosed in the prior art proposal leads also to an undesirable reduction in the mass-productivity. In addition, the elongated path of light between the light-emitting element and the light-receiving element results in absorption and scattering losses of light giving rise to an undesirable reduction in the efficiency of photo-coupling.

Preferred embodiments of the photo-coupler according to the present invention which overcomes the aforementioned prior art defects will now be described in detail.

Figure 2:
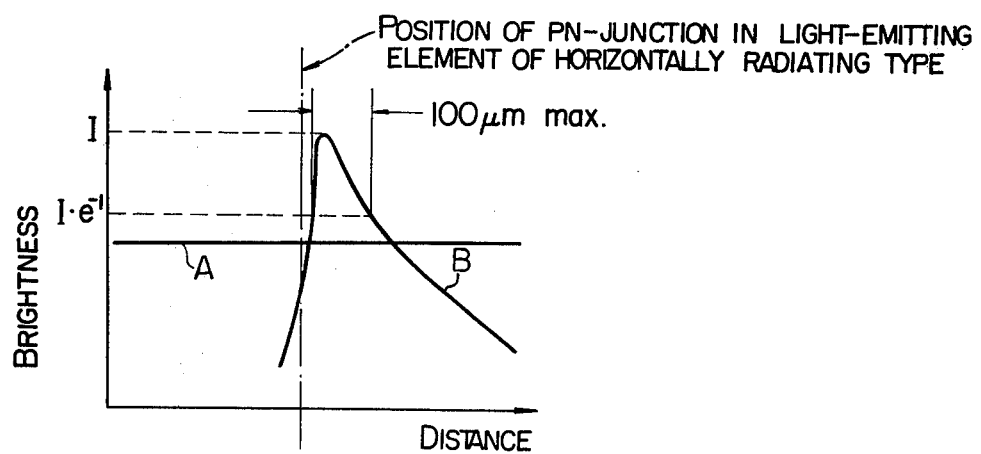
FIG. 2 is a graph illustrating the difference in luminance distribution between a light-emitting element of vertically radiating type and a light-emitting element of horizontally radiating type.

FIG. 2 is a graphic representation of the luminance distribution characteristic of a light-emitting element of horizontally radiating type relative to that of a light-emitting element of vertically radiating type. It will be seen from the luminance distribution characteristic curve A in FIG. 2 that the intensity of light emitted from the light-emitting element of vertically radiating type is approximately uniform throughout its parallel surface to the PN junction. On the other hand, as seen from the luminance distribution characteristic curve B in FIG. 2, the intensity of light emitted from the light-emitting element of horizontally radiating type has a peak in the vicinity of PN junction in the P-type region, and this peak value is far larger than that of the light-emitting element of vertically radiating type.

Figure 3:
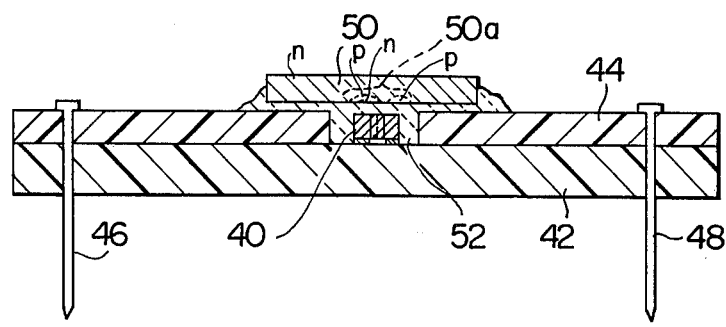
FIG. 3 is a schematic sectional view of an embodiment of the photo-coupler according to the present invention.

FIG. 3 is a schematic sectional view of an embodiment of the photo-coupler according to the present invention. Referring to FIG. 3, the photo-coupler comprises a ceramic base provided by fixedly laminating on a ceramic substrate 42, another ceramic substrate 44 having a central opening, a light-emitting assembly 40 received in the central opening of the ceramic substrate 44 in the ceramic base, and a light-receiving element bearing substrate 50 fixed to the ceramic substrate 44 in the ceramic base to receive light emitted from the light-emitting assembly 40. Printed conductive interconnection layers (not shown) are provided on the upper surface of the ceramic substrate 44 to extend from the fixed location of the substrate 50 to a pair of lead pins 46 and 48 respectively. A photo thyristor 50a is formed in one principal surface of the substrate 50 so that its forward voltage blocking PN junction portion can be irradiated or triggered with light emitted from the light-emitting assembly 40. The electrode layers of the photo thyristor 50a are electrically insulated from the substrate surface by a film of electrical insulator such as $SiO_2$. It will be seen in FIG. 3 that the substrate 50 is face-down bonded to the upper surface of the ceramic substrate 44 so that the cathode and anode layers of the photo thyristor 50a can be electrically connected to the printed conductive interconnection layers extending to the lead pins 46 and 48 respectively.

The light-emitting assembly 40 is fixed to the upper surface of the ceramic base 42 within the central opening of the ceramic base 44, and a light-pervious electrical insulation resin material 52 such as a silicone resin or epoxy resin is filled to heat-set in the central opening of the ceramic base 44 and in the void between the substrates 50 and 44.

Figure 4:
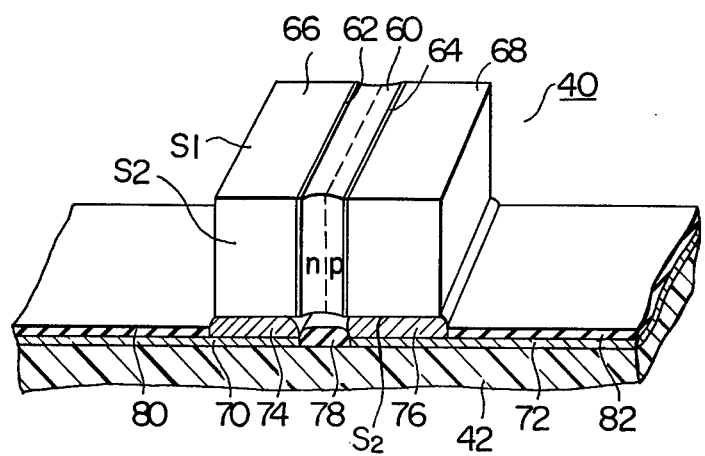
FIG. 4 is an enlarged perspective view, with part in section, of the light-emitting assembly incorporated in the photo-coupler shown in FIG. 3.

Reference is now made to FIG. 4 which clearly illustrates the structure of the light-emitting assembly 40 and the manner of fixing the same. Referring to FIG. 4, the light-emitting assembly 40 comprises an infrared light-emitting diode pellet 60 of GaAs, and a pair of block-like electrodes 66 and 68 of, for example, copper firmly bonded to the opposite parallel surfaces of the light-emitting diode pellet 60 by a pair of metal films 62 and 64, respectively, which provide ohmic contact at the joints. A practical process for making this light-emitting diode assembly 40 will be described in detail later. Printed conductive interconnection layers 70 and 72 associated with the anode and cathode of the diode pellet 60 in the light-emitting diode assembly 40 are provided on the upper surface of the lower ceramic substrate 42 to extend to positions at which diode electrode lead pins (not shown) analogous to the lead pins 46 and 48 shown in FIG. 3 are mounted. The substrate surface portion, on which the printed conductive interconnection layers 70 and 72 are not provided, is covered with a film 78 of glass, while the substrate surface portions having these printed conductive interconnection layers 70 and 72 thereon are covered with films 80 and 82 of glass respectively. The electrodes 66 and 68 of the light-emitting diode assembly 40 are firmly bonded at the surface remote from the parallel to the light radiating surface $S_1$ to the associated conductive interconnection layers 70 and 72 by solder layers 74 and 76 respectively.

In the operation of the device shown in FIGS. 3 and 4, the light-emitting diode pellet 60 emits light in response to the triggering of its light-emitting PN junction through the electrodes 66 and 68, and the emitted light travels a minimum distance to irradiate the depletion layer of the forward voltage blocking PN junction portion of the photo thyristor 50a disposed opposite to the light radiating surface $S_1$ of the diode pellet 60. The efficiency of photo coupling in this case is determined principally by the distance between the light-emitting PN junction and the light-receiving PN junction and the mounting precision of the diode 40 and the substrate 50. The efficiency of photo-coupling in the device shown in FIGS. 3 and 4 is high since the above distance can be made quite smaller, and the mounting tolerance in the order of 100 $\mu$m can be provided. Therefore, the photo thyristor 50a is efficiently triggered to be turned on by the optical output of the light-emitting diode 60.

A process for fabricating the device shown in FIGS. 3 and 4 will be briefly described by way of example.

The steps of fabricating the light-emitting assembly 40 comprise preparing a light-emitting diode wafer of Si-doped GaAs by a liquid phase growth method, and grinding the P-type layer and N-type layer of the diode wafer to respective thicknesses of 80 $\mu$m and 120 $\mu$m. Then, ohmic-contact providing layers of Au-Zn and Au and an alloying layer of Au-Ge are deposited on the P-type layer of the diode wafer by vacuum evaporation, and similarly, ohmic-contact providing layers of Au-Ge-Ni and Au and an alloying layer of Au-Ge are deposited on the N-type layer of the diode wafer by vacuum evaporation. Subsequently, a pair of electrode-providing wafers of copper about 500 $\mu$m thick are superposed on the vacuum evaporated layers provided on the P-type layer and N-type layer respectively of the diode wafer and are subjected to alloying treatment at a temperature of about 390° C. in an inert gas atmosphere on $N_2$ to firmly bond the electrodes of copper to the opposite principal surfaces of the diode wafer of GaAs. The diode wafer is subsequently diced into pellets each having a surface area of about 400 $\mu$m $\times$ 400 $\mu$m, and the diced surfaces of the pellets are then subjected to grinding. Etching treatment is then applied to each pellet having the ground surfaces to cleanse the same, thereby providing a light-emitting assembly 40 as shown in an enlarged fashion in FIG. 4. Of the ground surfaces $S_1$ and $S_2$, the light radiating surface $S_1$ is preferably especially finely ground.

The light-emitting assembly 40 thus fabricated is placed on a lower ceramic substrate 42 while interposing therebetween solder layers 74 and 76 of Pb-Sn solder as shown in FIG. 4. This lower ceramic substrate 42 has already been provided with printed conductive interconnection layers 70 and 72, and the surface thereof has already been covered with glass films 78, 80 and 82 as shown in FIG. 4. After placing the light-emitting assembly 40 on the lower ceramic substrate 42, heat treatment is applied at a temperature of about 320° C. in an inert gas atmosphere of $N_2$ to firmly bond the block-like electrodes 66 and 68 of copper to the conductive interconnection layers 70 and 72 through the solder layers 74 and 76 respectively at the surface $S_2$ opposite to the light radiating surface $S_1$.

A photo thyristor bearing substrate 50 of silicon is then face-down bonded on an upper ceramic substrate 44 by means of the controlled collapse bonding technique as shown in FIG. 3. A light-pervious heat-setting electrical insulation resin material such as a slicone resin or epoxy resin is then filled in the void between the substrates 50 and 44 and is set to provide a light-pervious electrical insulation resin layer 52 as shown in FIG. 3 to provide the desired photo-coupler structure.

It will be clear from the above description of the first embodiment of the present invention that the electrical interconnection can be provided on the surface of the light-emitting element of horizontally radiating type which surface is parallel to the electrical interconnection layer bearing surface of the light-receiving element. Therefore, the element fixing operation and the electrical interconnection operation can be simultaneously carried out to ensure a very high rate of mass production. Further, due to the fact that the opposite surfaces of the light-emitting diode pellet 60 are protected by the block-like copper electrodes 66 and 68, there is a reduced possibility of mechanical damage to the pellet 60 during the stages of transportation, mounting and fixing of the light-emitting assembly 40 thereby facilitating these operations and greatly improving the yield rate.

Not only the photo-coupler according to the first embodiment of the present invention can operate with a high efficiency of photo-coupling as above described, but also it has an excellent heat radiating capability since the block-like copper electrodes bonded to the opposite sides of the pellet of the light-emitting element function also as a heat sink. The excellency of the heat radiating capability of the light-emitting assembly means that it is advantageous in that driving power for the light-emitting element can be increased, that the useful life of the light-emitting element can be extended, and also that the desired reliability can be ensured. It was actually confirmed that saturation occurred with current of 80 mA in the light-emitting assembly for which the present invention was not applied, whereas saturation did not occur up to a current value of 130 mA in the light-emitting assembly according to the present invention, and the application of the present invention could thus increase the level of driving power.

Figure 5:
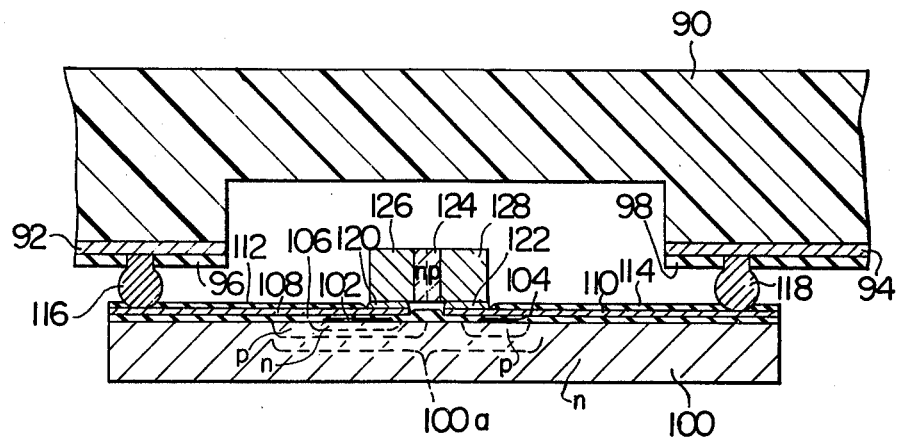
FIG. 5 is a schematic sectional view of part of another embodiment of the photo-coupler according to the present invention.

FIG. 5 is a schematic sectional view of part of another embodiment of the photo-coupler according to the present invention.

Referring to FIG. 5, printed conductive interconnection layers 92 and 94 for electrical connection to a light-emitting element are provided on the lower surface of a ceramic substrate 90 having a central recess, and the surface portions of the ceramic substrate 90 not having the conductive interconnection layers and the surface portions having the conductive interconnection layers are covered with glass films 96 and 98. Similar printed conductive interconnection layers (not shown) for electrical connection to a light-receiving element are also provided on the lower surface of the ceramic substrate 90. A light-receiving element bearing substrate 100 of silicon has a photo thyristor 100a formed in one of its principal surfaces. This substrate 100 is bonded to the ceramic substrate 90 by solder layers 116 and 118 in such a relation that the said principal surface is disposed opposite the central recess of the ceramic substrate 90. A light-pervious electrical insulation film such as an SiO₂ film 106 covers the upper surface of the silicon substrate 100, and vacuum-evaporated conductive interconnection layers 108 and 110 of, for example, Au are deposited on this insulation film 106 to extend from the mounting position of the light-emitting element to the solder layers 116 and 118. The photo thyristor 100a comprises an anode layers 102 and a cathode layer 104 which extend also on the insulation film 106 from positions (not shown). The conductive interconnection layers 108 and 110 extending on the insulation film 106 covering the upper surface of the silicon substrate 100 are electrically connected to the printed conductive interconnection layers 92 and 94 on the ceramic substrate 90 by the solder layers 116 and 118 to be electrically connected to other conductive interconnection layers or circuit parts provided on the ceramic substrate 90. The surface portions of the insulation film 106 not having the conductive interconnection layers formed thereon and the surface portions of the conductive interconnection layers 108 and 110 are covered with electrical insulation films 112 and 114 of material such as SiO₂. These insulation films 112 and 114 may be provided by deposition from a vapor phase. Openings are formed in these insulation films 112 and 114 to expose part of the conductive interconnection layers 108 and 110, and eutectic alloy layers 120 and 122 are disposed in these openings to fix a light-emitting assembly to the silicon substrate 100.

The light-emitting assembly comprises a light-emitting diode pellet 124 of GaAs, and a pair of block-like electrodes 126 and 128 of silicon having a low resistivity (a high impurity concentration) firmly bonded to the opposite surfaces of the diode pellet 124 by eutectic alloy layers of Au-Si. The process for making this light-emitting assembly is similar to that described with reference to FIG. 4. For example, the steps of fabricating the light-emitting assembly comprises depositing ohmic-contact providing and alloying layers of Au on the opposite surfaces of a diode wafer, superposing electrode-providing silicon wafers on the ohmic-contact providing and alloying layers deposited on the opposite surfaces of diode wafer, applying alloying treatment of the eutectic alloy of Au-Si at a temperature of about 380° C. in an inert gas atmosphere, and then dicing the wafer laminate into pellets. In the light-emitting assembly thus obtained, the block-like electrodes 126 and 128 are firmly bonded to and electrically connected with the conductive interconnection layers 108 and 110 by the ternary eutectic alloy layers 120 and 122 of Au - Ge-Si respectively. Such an electrical connection may be provided by previously depositing a film of Au - Ge on the portions of the conductive interconnection layers 108 and 110 to be electrically connected with the block-like electrodes 126 and 128 of silicon, and heating to fuse the film of Au - Ge to bond the block-like electrodes 126 and 128 of silicon to the conductive interconnection layers 108 and 110 respectively. The ternary eutectic alloy of Au - Ge - Si is preferably used to firmly bond the light-emitting assembly to the light-receiving element bearing substrate 100 of silicon, because the block-like electrodes 126 and 128 of silicon are bonded to the diode pellet 124 by the binary eutectic alloy of Au - Si. Therefore, the use of the ternary eutectic alloy of Au - Ge - Si having a melting point lower than that of the binary eutectic alloy of Au - Si can prevent undesirable separation of the parts constituting the light-emitting assembly.

The photo-coupler according to the second embodiment of the present invention shown in FIG. 5 has advantages and features similar to those of the first embodiment described with reference to FIGS. 3 and 4. In addition, it has such an advantage that the distance between the light-emitting assembly and the light-receiving element bearing substrate may be further decreased and the position of light-emitting assembly may be determined with high precision to attain more improvement in the efficiency of photo coupling, due to the fact this close distance can be determined without regard to the precision of dicing the wafer for obtaining the light-emitting assembly. In the first and second embodiments of the present invention, the light-emitting assembly is obtained by dicing a wafer laminate into pellets. This dicing operation can be carried out more easily in the case of the second embodiment comprising the silicon electrodes than in the case of the first embodiment comprising the copper electrodes.

Figure 6:
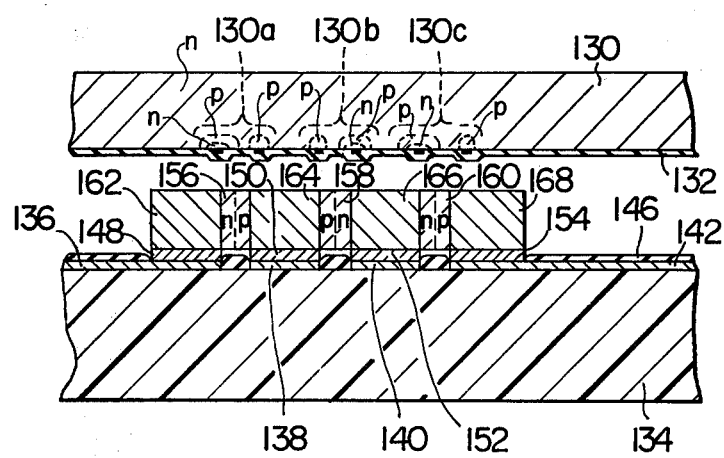
FIG. 6 is a schematic sectional view of part of still another embodiment of the photo-coupler according to the present invention.

FIG. 6 is a schematic sectional view of part of still another embodiment of the photo coupler according to the present invention.

Referring to FIG. 6, three photo thyristors 130a, 130b and 130c are formed in an in-line relationship one of the principal surfaces of a light-receiving element bearing substrate 130 of silicon, and this principal surface of the substrate 130 is covered with a light-pervious electrical insulating film 132 of material such as SiO₂. A light-emitting assembly is fixed on one principal surface of a ceramic substrate 134. Printed conductive interconnection layers 136, 138, 140 and 142 are provided on this principal surface of the ceramic substrate 134, and the surface portions of these conductive interconnection layers and the surface portions of the ceramic substrate 134 not having the conductive interconnection layers formed thereon are covered with a film 146 of glass. The light-receiving element bearing substrate 130 of silicon and the ceramic substrate 134 are disposed opposite to each other with a predetermined very short distance therebetween provided by fixing means (not shown).

The light-emitting assembly is obtained by alternately laminating three light-emitting diode wafers of GaAs having respective polarities of P-N, N-P and P-N together with electrode-providing wafers of copper, bonding the copper electrodes to the diode wafers by alloying treatment to obtain a wafer laminate, and then dicing this wafer laminate into pellets. Thus, the light-emitting assembly is of series construction in which diode pellets 156, 158 and 160 of GaAs are respectively interposed between four block-like electrodes 162, 164, 166 and 168 of copper as seen in FIG. 6. These block-like electrodes 162 to 168 are firmly bonded by solder layers 148 to 154 to the corresponding conductive interconnection layers 136 to 142 respectively as shown. In bonding the block-like electrodes 162 to 168 to the corresponding conductive interconnection layers 136 to 142, it is essential that the individual light-emitting PN junction of the light-emitting diode pellets 156 to 160 be correctly registered with the associated photo thyristors 130a to 130c respectively. This registration can be easily achieved according to the present invention. In FIG. 6, the conductive interconnection layers 136 and 140 are connected to the cathode of the diode pellets 156 to 160, while the conductive interconnection layers 138 and 142 are connected to the anode of these diode pellets. In other words, the three light-emitting diodes in the light-emitting assembly are arranged to operate in parallel with one another although they are arranged in series structurally.

The construction of the photo coupler shown in FIG. 6 has advantages and features similar to those described with reference to FIGS. 3 and 4. This construction is especially useful when an improvement in the degree of integration is desired.

While preferred embodiments of the present invention have been described in detail by way of example, it is apparent that the present invention is in no way limited to such specific embodiments, and various changes and modifications may be made therein without departing from the spirit of the present invention. For example, in lieu of copper and silicon referred to in the embodiments as a material for providing the block-like electrodes, any other suitable materials may be used which include metals such as Al, Ag and Mo, and semiconductors of low resistivity such as Ge and GaAs. A semiconductor used for providing the light-emitting element and a material used for providing the block-like electrodes are preferably the same in order to minimize the thermal stress tending to appear due to the difference between the coefficients of thermal expansion of the materials of the electrodes and light-emitting element. This minimization of the thermal stress is useful in improving the resistance against heat of the light-emitting assembly. Further, although a light-emitting diode of GaAs and a photo thyristor have been referred to as the light-emitting element and light-receiving element respectively, it is apparent that any other suitable light-emitting elements and light-receiving elements can be used in lieu of the specific ones.

It will be understood from the foregoing detailed description of the photo coupler according to the present invention that one of the side surfaces of block-like electrodes bonded to the opposite sides of a light-emitting diode pellet of horizontally radiating type is utilized to attain fixing of the light-emitting element and connection of the same to electrical interconnection at the same time. Therefore, the desired increase in the efficiency of photo coupling and the desired improvement in the mass-productivity can both be satisfied to provide a photo coupler exhibiting a high operating performance although it can be fabricated at a low cost.

We claim:

1. A photo-coupled semiconductor device comprising a light-emitting semiconductor element, a light-receiving semiconductor element, and means for supporting said two semiconductor elements, wherein said supporting means comprises first and second substrates extending in parallel to each other, said first substrate supporting said light-emitting semiconductor element and said second substrate supporting said light receiving semiconductor element, said second substrate having an opening for providing an optical path extending between said first and second substrates for photo-coupling said two semiconductor elements to each other, and said light-emitting semiconductor element being coupled to at least two rigid electrodes having surfaces parallel to said parallel substrates of said supporting means, said rigid electrodes being electrically and mechanically connected at one of their parallel surfaces by solder to conductive interconnection layers exposed at predetermined positions of one of said paralllel substrates of said supporting means wherein said light-emitting semiconductor element comprises a light-emitting assembly including at least one pellet of a light-emitting element of a horizontally radiating type, and said rigid electrodes comprise a pair of block-like electrodes mounted on opposite surfaces of said pellet.

2. A photo-coupled semiconductor device as claimed in claim 1, wherein said light-receiving semiconductor element comprises a semiconductor substrate having at least one light-receiving element formed therein, and said supporting means comprises a ceramic base provided by laminating and fixing to each other said second ceramic substrate having at least one central opening for receiving therein said light-emitting assembly, and said first ceramic substrate having conductive interconnection layers exposed at predetermined positions of its surface, said light-emitting assembly being mounted on said ceramic base, and said semiconductor substrate being fixed to said ceramic base for receiving light radiated from said light-emitting assembly.

3. A photo-coupled semiconductor device as claimed in claim 2, wherein said opening is filled with a light-pervious electrical insulation resin.

4. A photo-coupled semiconductor device as claimed in claim 1, wherein said block-like electrodes are formed of a semiconductive material which is similar to the material of said pellet.

5. A photo-coupled semiconductor device as claimed in claim 1, wherein said block-like electrodes are formed of a conductive material.

6. A photo-coupled semiconductor device as claimed in claim 3, wherein said light-pervious insulation resin is an epoxy resin.

7. A photo-coupled semiconductor device as claimed in claim 1, wherein said semiconductor elements are electrically and mechanically connected to said conductive interconnection layers on said parallel substrates of said supporting means with a mounting tolerance of less than 100 μm.

8. A photo-coupled semiconductor device as claimed in claim 1, wherein said light-emitting semiconductor element comprises a light-emitting assembly including a plurality of pellets of light-emitting element of horizontally radiating type alternately laminated together with block-like electrodes in a polarity pattern of P-N, N-P and P-N, and said light-receiving semiconductor element comprises a semiconductor substrate having formed therein a plurality of light-receiving elements corresponding to said pellet.

9. A photo-coupled semiconductor device comprising a light-emitting semiconductor element, a light-receiving semiconductor element, and means for supporting said two semiconductor elements, wherein said supporting means comprises an electrical insulation layer provided on the light-receiving semiconductor element and a ceramic substrate parallel to said electrical insulation layer, said ceramic substrate having a central recess for housing said light-emitting semiconductor element, said light-emitting semiconductor element being coupled to at least two rigid electrodes having surfaces parallel to said parallel electrical insulation layer and ceramic substrate, said rigid electrodes being electrically and mechanically connected at one of their parallel surfaces by solder to conductive interconnection layers exposed at predetermined positions of the electrical insulation layer of said light-receiving element so as to attain photo-coupling between the light-receiving element and the light-emitting element, the rigid electrodes of said light-receiving semiconductor element also being electrically and mechanically connected by solder to conductive interconnection layers exposed at predetermined positions of said ceramic substrate, wherein said light-emitting semiconductor element comprises a light-emitting assembly including at least one pellet of a light-emitting element of the horizontally radiating type, and said rigid electrodes comprise a pair of block-like electrodes mounted on opposite surfaces of said pellet.

* * * * *